United States Patent
Carroll (10) Patent No.: US 6,546,275 B2
(45) Date of Patent: Apr. 8, 2003

(54) DETERMINATION OF THE ARTERIAL INPUT FUNCTION IN DYNAMIC CONTRAST-ENHANCED MRI

(75) Inventor: Timothy J. Carroll, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 76 days.

(21) Appl. No.: 09/888,973

(22) Filed: Jun. 25, 2001

(65) Prior Publication Data

US 2003/0045791 A1 Mar. 6, 2003

(51) Int. Cl.$^7$ ............................................. A61B 5/055
(52) U.S. Cl. ...................... 600/419; 600/410; 600/420
(58) Field of Search ............................... 600/419, 420, 600/410, 411, 415, 407, 408, 425, 427

(56) References Cited

U.S. PATENT DOCUMENTS

| | | | |
|---|---|---|---|
| 5,133,357 A | * 7/1992 | Dumoulin et al. | 600/419 |
| 5,402,785 A | 4/1995 | Leigh et al. | |
| 5,488,297 A | 1/1996 | Nakada | |
| 5,492,123 A | 2/1996 | Edelman | |
| 5,579,774 A | 12/1996 | Miller et al. | |
| 5,590,654 A | * 1/1997 | Prince | 600/420 |
| 5,671,741 A | 9/1997 | Lnag et al. | |
| 5,865,738 A | * 2/1999 | Morcos et al. | 600/407 |
| 5,865,757 A | 2/1999 | Hoeft | |
| 5,993,398 A | * 11/1999 | Alperin | 600/587 |
| 6,073,042 A | 6/2000 | Simonetti | |
| 6,078,176 A | 6/2000 | McKinnon | |
| 6,275,723 B1 | * 8/2001 | Ferris et al. | 600/417 |
| 6,377,832 B1 | * 4/2002 | Bergman et al. | 600/408 |
| 6,408,201 B1 | * 6/2002 | Foo et al. | 600/410 |
| 2001/0053878 A1 | * 12/2001 | Ferris et al. | 600/415 |

OTHER PUBLICATIONS

Determination of Arterial Input Function for Quantification of Cerebral Blood Flow with Dynamic Susceptibility Contrast–Enhanced MR Imaging Using Fuzzy Clustering, 22nd Annual EMBS International Conference, Jul. 23–28, 2000, pp. 2153–2156, Kenya Murase, et al.

Automated Determination of the Arterial Input Function for Quantitative MR Perfusion, Proc. Intl. Soc. Mag. Reson. Med. 8 (2000) p. 740, Morris, et al.

Quantification of Regional Cerebral Blood Flow and Volume By Dynamic Contrast Enhanced MR Imaging, p. 278, K. Rempp, et al.

Automated Region–Specific VTRAC Segmentation in Peripheral MRA, Proc. Intl. Soc. Mag. Reson. Med. 8 (2000), p. 1807, J. Du, et al.

Determination of Cerebral Blood Volume and Mean Transit Time by Dynamic Contrast Enhanced MR Imaging in Patients with Acute Stroke: A Comparison of Four Post Processing Methods, Proc. Intl. Soc. Mag. Reson. Med. 8 (2000), p. 527, J. Perkio, et al.

(List continued on next page.)

Primary Examiner—Hieu T. Vo
(74) Attorney, Agent, or Firm—Quarles & Brady, LLP (57) ABSTRACT

A contrast-enhanced MRI time course study of the brain is performed and images are produced which indicate hemodynamic parameters such as cerebral blood flow (CBF), cerebral blood volume (CBV) and mean transit time (MTT). An arterial input function (AIF) required to quantitatively measure the hemodynamic parameters is automatically produced.

11 Claims, 6 Drawing Sheets

OTHER PUBLICATIONS

Automatic Determination of the Arterial Input Function (AIF) in Dynamic Contrast–Enhanced MRI in Acute Storke, Proc Intl. Soc. Mag. Reson. Med 9 (2001), p. 1578Carroll, et al.

High Resolution Measurement of Cerebral Blood Flow using Intravascular Tracer Bolus Passages, Part I: Mathematical Approach and Statistical Analysis, MRM 36:715–725 (1996) Ostergaard, et al.

Quantification of Regional Cerebral Blood Flow and Volume with Dynamic, Susceptibility Contrast–enhanced MR Imaging, Radiology 1994; 193:637–641, Rempp, et al.

Perfusion Imaging with NMR Contrast Agents, MRM 14, 249–265 (1990), Rosen et al.

* cited by examiner

FIG. 8

DETERMINATION OF THE ARTERIAL INPUT FUNCTION IN DYNAMIC CONTRAST-ENHANCED MRI

CROSS REFERENCE TO RELATED APPLICATIONS

This application claims the benefit of U.S. Provisional patent application Ser. No. 60/285,293 filed on Apr. 20, 2001 and entitled "Determination Of The Arterial Input Function In Dynamic Contrast-Enhanced MRI".

STATEMENT REGARDING FEDERALLY SPONSORED RESEARCH

This invention was made with United Stated Government support awarded by the following agency: NIH grant HL62425. The United States Government has certain rights in this invention.

BACKGROUND OF THE INVENTION

The field of the invention is magnetic resonance imaging (MRI), and particularly the measurement of hemodynamic parameters such as cerebral blood flow (CBF) and cerebral blood volume (CBV).

Ischemic stroke is one of the leading causes of death and disability. An important treatment for a stroke patient is the use of so-called "thrombolytic" agents, or "clot busting" drugs which have been shown to break tip blood clots that are the source of the stroke. These drugs must be administered within three to six hours of the ischemic event and considerable risk of cerebral hemorrhage is associated with their use.

In order to weigh the risks associated with such treatments, methods have been devised to assess the risk of further brain damage if the treatment is not used. One such method is to produce hemodynamically weighted MR images of the brain which reveal the "at risk" brain tissue. If produced promptly, these images can assist the physician and the patient in determining whether aggressive treatment methods are warranted. For example, if the hemodynamically weighted MR image reveals that very little further brain tissue is at risk due to the ischemic stoke, then the use of a thrombolytic agent is probably unwarranted. On the other hand, if such images indicate that critical brain tissue is at risk, then the risk of using the thrombolytic agent is warranted.

Hemodynamically weighted MR perfusion images of cerebral blood flow (CBF) may be acquired and used in combination with diffusion-weighted (DWI) MR images to delineate regions of viable brain parenchyma that are at risk of further infarction. The DWI MR image shows ischernic regions where brain cells have died, and the CBF image shows regions with reduced blood flow which indicates at risk tissue. The size of the "ischemic penumbra" surrounding ischernic tissues is a critical component in evaluating treatment options.

To be of clinical value, the hemodynamically weighted images must be acquired and produced expeditiously. As indicated above, the risks associated with thrombolytic agents increases with time and the prevailing opinion is that such agents should not be used more than 3 to 6 hours after the ischernic event. Diffusion-weighted MR images can be acquired and reconstructed in a matter of minutes using MRI systems as described, for example, in U.S. Pat. Nos. 5,492,123; 6,078,176; 5,671,741 and 5,488,297. The same cannot be said of current methods for producing CBF, MR images.

As described, for example, by K. A. Kemp, et al. "Quantification of Regional Cerebral Blood Flow and Volume with Dynamic Susceptibility ContrastEnhanced MR Imaging" Radiology 1994; 193:637–641, it is possible to assess regional cerebral hemodynamics by analyzing NMR signal intensity changes after the first pass of a paramagnetic contrast medium. While passing through the capillary network, a short bolus of contrast material produces local magnetic field inhomogeneities that lead to a reduction in the transverse magnetization relaxation time $T2^*$ of the bulk tissue. This susceptibility effect can be recorded by a series of rapid $T2^*$-weighted gradient-echo images which reveal how the NMR signal changes during the first pass of the contrast agent. The resulting NMR signal intensity versus time curves can be converted into contrast agent concentration-time curves. By using the indicator dilution theory, one can then determine two important hemodynamic parameters from these curves: the cerebral blood flow (CBF), known as tissue perfusion, and the cerebral blood volume (CBV). However, the concentration of contrast agent in the arterial blood pool—the "arterial input function" (AIF)—must be known if absolute quantification of the CBV and CBF measurements are to be achieved.

Current methods used to measure the AIF require a step in which the operator manually selects a region of interest (ROI), based on anatomic information which depicts an artery. The concentration-time curve from all voxels included in the ROI are then used to calculate the AIF as described, for example, by L. Ostergaard et al "High Resolution Measurement of Cerebral Blood Flow Using Intravascular Tracer Bolus Passages. Part 1: Mathematical Approach and Statistical Analysis", Magnetic Resonance In Medicine, 36:715–725 (1996) and B. R. Rosen et al "Perfusion Imaging With NMR Contrast Agents," Magnetic Resonance In Medicine, 14, 249–265 (1990). This presents two problems. First, such a manual operation requires considerable time to perform and this additional time may be critical. And second, it is very difficult to identify a an ROI in a two-dimensional image which is 100% within an artery. Typically, most of the selected an ROI will lie within an artery, but part of the an ROI will lie in surrounding tissues. Because of this "partial volume effect", the peak value of its concentration-time curve will be less than a true, 100% arterial voxel, and the width of the peak in the concentration-time curve will be increased. This measurement error results in an error in the AIF, which in turn produces an error in the absolute value of the CBF and the CBV.

SUMMARY OF THE INVENTION

The present invention relates to the measurement of hemodynamic parameters such as cerebral blood flow, and more particularly, to a method which enables the rapid and automatic production of MR images that more accurately indicate the value of homodynamic parameters throughout a selected region of interest. The present invention is a method for automatically identifying an arterial voxel in a data set acquired during a dynamic contrast-enhanced MR study and calculating therefrom the arterial input function (AIF). Hemodynamic parameters are calculated using the acquired data set and this calculated AIF.

A general object of the invention is to shorten the time needed to produce hemodynamic parameter images. No manual steps are required after acquisition of the data set during the dynamic study. As a result, images can be produced promptly which enable the physician to assess the risks of clinical actions.

Another object of the invention is to provide a more accurate AIF. This is accomplished by first identifying that portion of the dynamic study data set which indicates first passage of the contrast bolus through the region of interest. Within this limited data set, the signal produced by each voxel in the region of interest during first passage is examined to select the one voxel which best exhibits arterial blood flow characteristics. AIF is calculated using the NMR signal produced by this voxel.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
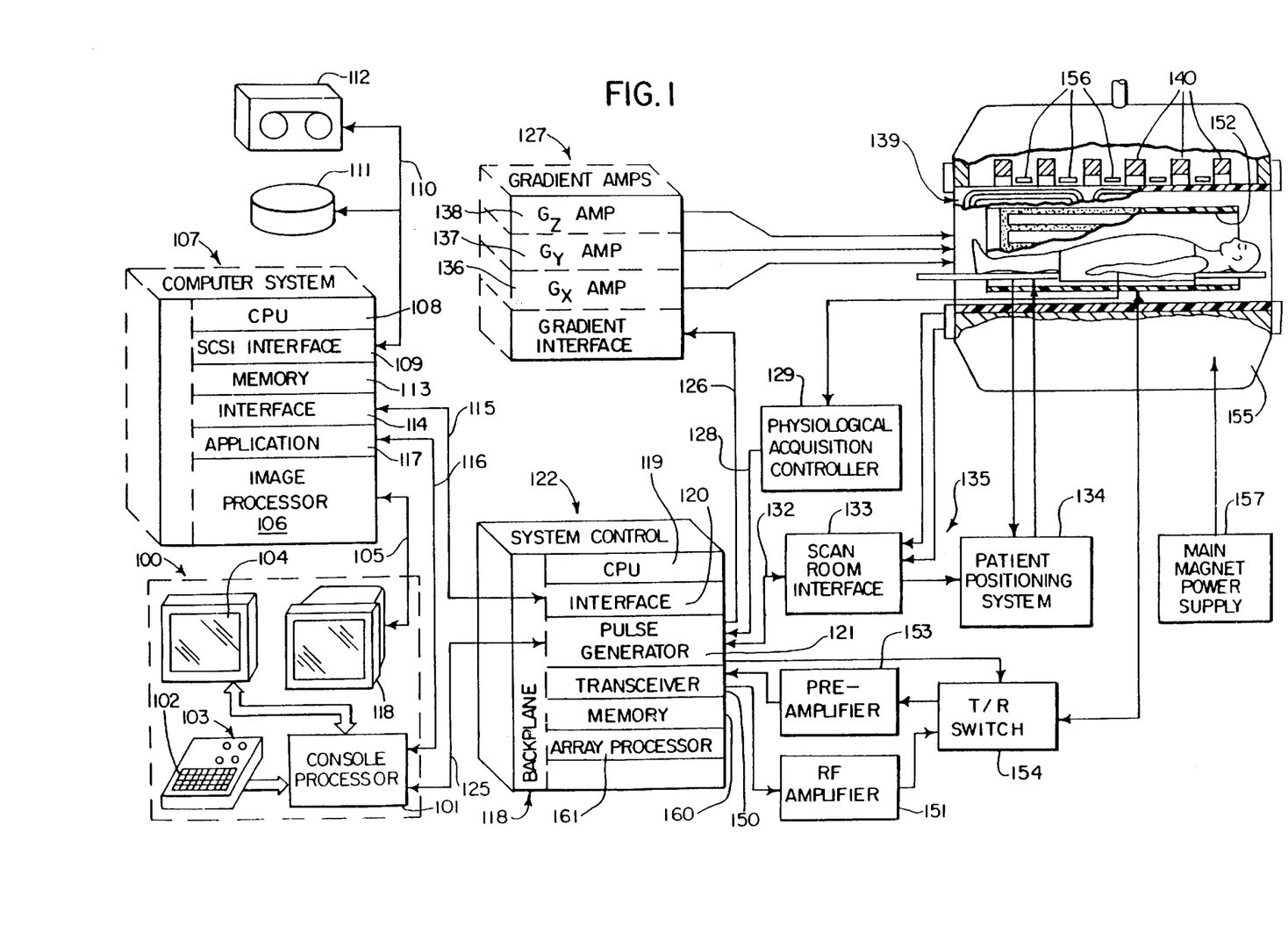
FIG. 1 is a block diagram of an NMR system which employs the present invention.

Referring first to FIG. 1, there is shown the major components of a preferred NMR system which incorporates the present invention and which is sold by the General Electric Company under the trademark "SIGNA". The operation of the system is controlled from an operator console 100 which includes a console processor 101 that scans a keyboard 102 and receives inputs from a human operator through a control panel 103 and a plasma display/touch screen 104. The console processor 101 communicates through a communications link 116 with an applications interface module 117 in a separate computer system 107. Through the keyboard 102 and controls 103, an operator controls the production and display of images by an image processor 106 in the computer system 107, which connects directly to a video display 118 on the console 100 through a video cable 105.

The computer system 107 is formed about a backplane bus which conforms with the VME standards, and it includes a number of modules which communicate with each other through this backplane. In addition to the application interface 117 and the image processor 106, these include a CPU module 108 that controls the WE backplane, and an SCSI interface module 109 that connects the computer system 107 through a bus 110 to a set of peripheral devices, including disk storage 111 and tape drive 112. The computer system 107 also includes a memory module 113, known in the art as a frame buffer for storing image data arrays, and a serial interface module 114 that links the computer system 107 through a high speed serial link 115 to a system interface module 120 located in a separate system control cabinet 122.

The system control 122 includes a series of modules which are connected together by a common backplane 118. The backplane 118 is comprised of a number of bus structures, including a bus structure which is controlled by a CPU module 119. The serial interface module 120 connects this backplane 118 to the high speed serial link 115, and pulse generator module 121 connects the backplane 118 to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing of and length of the data acquisition window. The pulse generator module 121 also connects through serial link 126 to a set of gradient amplifiers 127, and it conveys data thereto which indicates the timing and shape of the gradient pulses that are to be produced during the scan. The pulse generator module 121 also receives patient data through a serial link 128 from a physiological acquisition controller 129. The physiological acquisition control 129 can receive a signal from a number of different sensors connected to the patient. For example, it may receive ECG signals from electrodes or respiratory signals from a bellows and produce pulses for the pulse generator module 121 that synchronizes the scan with the patient's cardiac cycle or respiratory cycle. And finally, the pulse generator module 121 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the pulse generator module 121 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 155 which includes a polarizing magnet 140 that produces a 1.5 Tesla polarizing field that extends horizontally through a bore. The gradient coils 139 encircle the bore, and when energized, they generate magnetic fields In the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed B 0, and the total magnetic field in the z direction is referred to as $B_z$, then $G_{x\partial}$ $B_z/\partial x$, $G_y = \partial B_z/\partial y$ and $G_z = \partial B_z/\partial z$, and the magnetic field at any point (x,y,z) in the bore of the magnet assembly 141 is given by $B(x,y,z) = B_o + G_x x + G_y y G_z z$. The gradient magnetic fields are utilized to encode spatial information into the NMR signals emanating from the patient being scanned.

Located within the bore 142 is a circular cylindrical whole-body RF coil 152. This coil 152 produces a circularly polarized RF field in response to RF pulses provided by a transceiver module 150 in the system control cabinet 122. These pulses are amplified by an RF amplifier 151 and coupled to the RF coil 152 by a transmit/receive switch 154 which forms an integral part of the RF coil assembly.

Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NIVIR signals are demodulated, filtered, and digitized in the receiver section of the transceiver 150.

The transmit/receive switch 154 is controlled by a signal from the pulse generator module 121 to electrically connect the RIF amplifier 151 to the coil 152 during the transmit mode and to connect the preamplifier 153 during the receive mode. The transmit/receive switch 154 also enables a separate local RF head coil to be used in the transmit and receive mode to improve the signal-to-noise ratio of the received NMR signals.

In addition to supporting the polarizing magnet 140 and the gradient coils 139 and RF coil 152, the main magnet assembly 141 also supports a set of shim coils 156 associated with the main magnet 140 and used to correct inhomogeneities in the polarizing magnet field. The main power supply 157 is utilized to bring the polarizing field produced by the superconductive main magnet 140 to the proper operating strength and is then removed.

The NMR signals picked up by the RF coil are digitized by the transceiver module 150 and transferred to a memory module 160 which is also part of the system control 122. When the scan is completed and an entire array of data has been acquired in the memory modules 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the video display 118 as will be described in more detail hereinafter.

Figure 2:
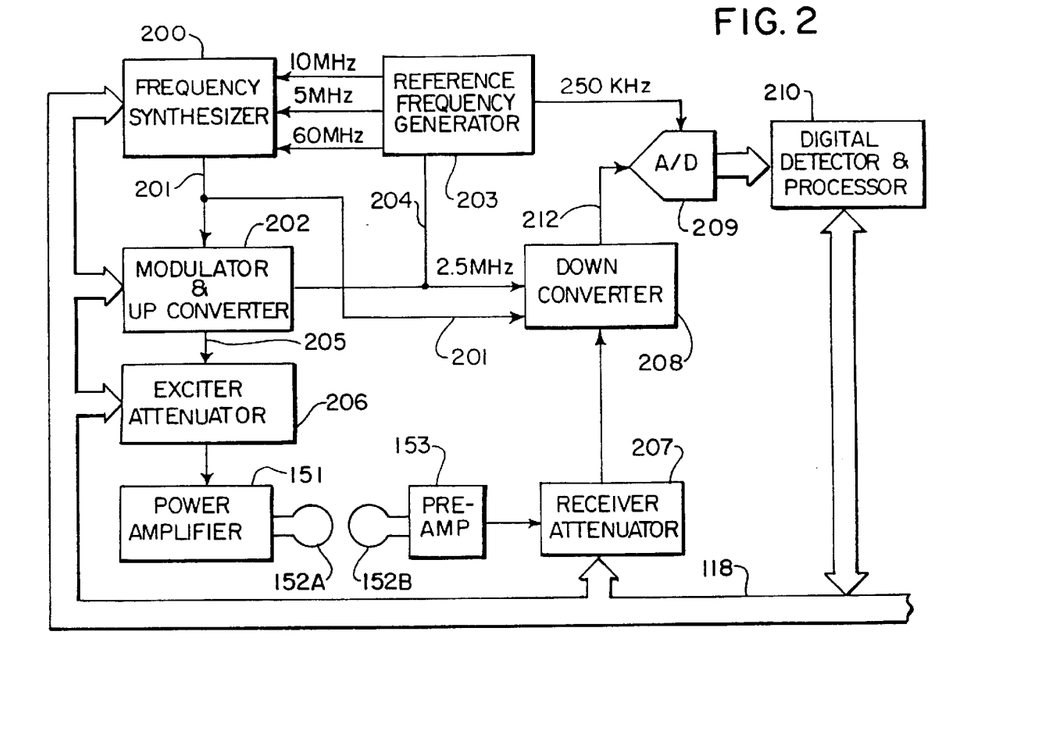
FIG. 2 is an electrical block diagram of the transceiver which forms part of the NMR system of FIG. 1.

Referring particularly to FIGS. 1 and 2, the transceiver 150 includes components which produce the RIF excitation field 131 through power amplifier 151 at a coil 152A and components which receive the resulting NMR signal induced in a coil 152B. As indicated above, the coils 152A and B may be a single whole-body coil, but a local RF coil specially designed for the head may also be used. The base, or carrier, frequency of the RF excitation field is produced under control of a frequency synthesizer 200 which receives a set of digital signals (CF) through the backplane 118 from the CPU module 119 and pulse generator module 121. These digital signals indicate the frequency and phase of the RF carrier signal which is produced at an output 201. The commanded RF carrier is applied to a modulator and up converter 202 where its amplitude is modulated in response to a signal R(t) also received through the backplane 118 from the pulse generator module 121. The signal R(t) defines the envelope, and therefore the bandwidth, of the RF excitation pulse to be produced. It is produced in the module 121 by sequentially reading out a series of stored digital values that represent the; desired envelope. These stored digital values may, in turn, be changed from the operator console 100 to enable any desired RF pulse envelope to be produced. The modulator and up converter 202 produces an RF pulse at the desired Larmor frequency at an output 205. The magnitude of the RF excitation pulse output through line 205 is attenuated by an exciter aftenuator circuit 206 which receives a digital command, TA, from the backplane 118. The attenuated RF excitation pulses are applied to the power amplifier 151 that drives the RF coil 152A.

Referring still to FIGS. 1 and 2 the NMR signal produced by the subject is picked up by the receiver coil 152B and applied through the preamplifier 153 to the input of a receiver aftenuator 207. The receiver aftenuator 207 further amplifies the NMR signal and this is attenuated by an amount determined by a digital attenuation signal (RA) received from the backplane 118. The receive aftenuator 207 is also turned on and off by a signal from the pulse generator module 121 such that it is not overloaded during RF excitation. The received NMR signal is at or around the Larmor frequency, which in the preferred embodiment is around 63.86 MHz for 1.5 Tesla. This high frequency signal is down converted in a two step process by a down converter 208 which first mixes the NMR signal with the carrier signal on line 201 and then mixes the resulting difference signal with the 2.5 MHz reference signal on line 204. The resulting down converted NMR signal on line 212 has a maximum bandwidth of 125 kHz and it is centered at a frequency of 187.5 kHz. The down converted NMR signal is applied to the input of an analog-to-digital (A/D) converter 209 which samples and digitizes the analog signal at a rate of 250 kHz. The output of the A/D converter 209 is applied to a digital detector and signal processor 210 which produce 16-bit in-phase (1) values and 16-bit quadrature (Q) values corresponding to the received digital signal. The resulting stream of digitized I and Q values of the received NMR signal is output through backplane 118 to the memory module 160 where they are employed to reconstruct an image.

To preserve the phase information contained in the received NMR signal, both the modulator and up converter 202 in the exciter section and the down converter 208 in the receiver section are operated with common signals. More particularly, the carrier signal at the output 201 of the frequency synthesizer 200 and the 2.5 MHz reference signal at the output 204 of the reference frequency generator 203 are employed in both frequency conversion processes. Phase consistency is thus maintained and phase changes in the detected NMR signal accurately indicate phase changes produced by the excited spins. The 2.5 MHz reference signal as well as 5, 10 and 60 MHz reference signals are produced by the reference frequency generator 203 from a common 20 MHz master clock signal. The latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
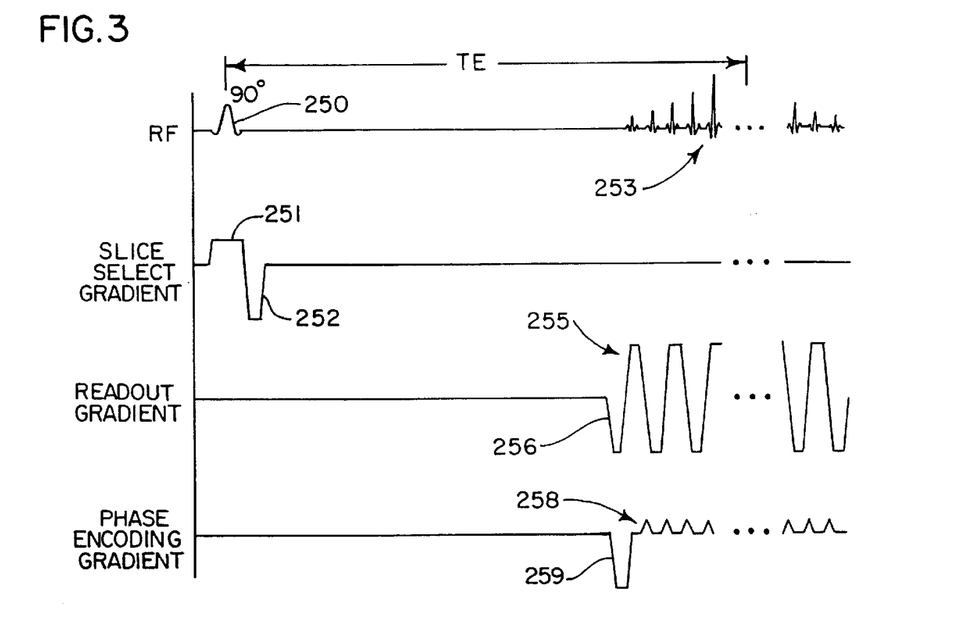
FIG. 3 is a graphic representation of the EPI pulse sequence used to practice the present invention on the NIVIR system of FIG. 1.

The EPI pulse sequence employed in the preferred embodiment of the invention is illustrated in FIG. 3. A 60° RF excitation pulse 250 is applied in the presence of a $G_z$ slice select gradient pulse 251 to produce transverse magnetization in a slice through the brain. The excited spins are rephased by a negative lobe 252 on the slice select gradient $G_z$ and then a time interval elapses before the readout sequence begins. A total of 64 separate NMR echo signals, indicated generally at 253, are acquired during the EPI pulse sequence. Each NMR echo signal 253 is a different view which is separately phase encoded to scan $k_y$-space from $k_y=-32$ to $k_y=+32$ in monotonic order. The readout sequence is positioned such that the view acquired at $k_y=0$ occurs at the desired echo time (TE). In the preferred embodiment an EPI pulse sequence with TE=60 ms and TR=2 sec. is used. From 10 to 14 slices having an in-plane resolution of 1.7 mm, a field of view of 22 cm and a slice thickness of 7 mm are acquired.

The NMR echo signals 253 are gradient recalled echo's produced by the application of an oscillating $G_x$ readout gradient field 255. The readout sequence is started with a negative readout gradient lobe 256 and the echo signals 253 are produced as the readout gradient oscillates between positive and negative values. A total of 128 samples are taken of each NMR echo signal 253 during each readout gradient pulse 255. The successive 64 NMR echo signals 253 are separately phase encoded by a series of $G_y$ phase encoding gradient pulses 258. The first pulse is a negative lobe 259 that occurs before the echo signals are acquired to encode the first view at $k_y=-32$. Subsequent phase encoding pulses 258 occur as the readout gradient pulses 255 switch polarity, and they step the phase encoding monotonically upward through $k_y$ space.

At the completion of the EPI pulse sequence, therefore, 128 separate frequency encoded samples of 64 separately phase encoded NMR echo signals 253 have been acquired. This 128×64 element array of complex numbers is Fourier transformed along both of its dimensions ($k_y$ and $k_x$) to produce a 128×64 element array of image data that indicates the NMR signal magnitude along each of its two dimensions (x and y). The 10 to 14 slices are positioned such that NMR data is acquired from the entire region of the subject's brain.

As will be explained in more detail below, the EPI pulse sequence is typically repeated to acquire time course NMR data for 14 slice images over the period during which a contrast agent bolus makes a first pass through the brain. The acquired NMR data is processed in the conventional manner to produce an NMR image data set of images for each of the 14 slices. As explained above, a two dimensional Fourier transformation is performed by the array processor 161 (FIG. 1) and the resulting NMR image data set is stored in the disk 111 for further processing by the image processor 106 according to the present invention.

Figure 4:
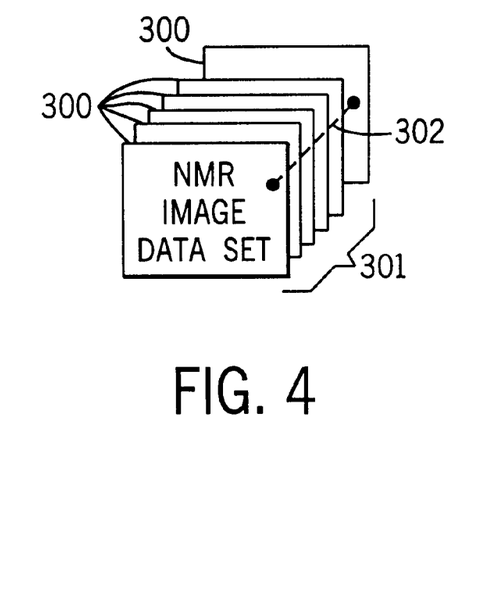
FIG. 4 is a pictorial representation of the NMR image data acquired with the pulse sequence of FIG. 3.

Referring to FIG. 4, this NMR image data set for one slice is organized as a set of 128×64 element 2D arrays 300 in which each element stores the magnitude of the NMR signal from one voxel in the scanned slice. While each array 300 is a "snap shot" of the brain slice at a particular moment in time during the time course study, the NMR image data set may also be viewed as a single 128×64×36 3D array 301 in which the third dimension is time.

Figure 5:
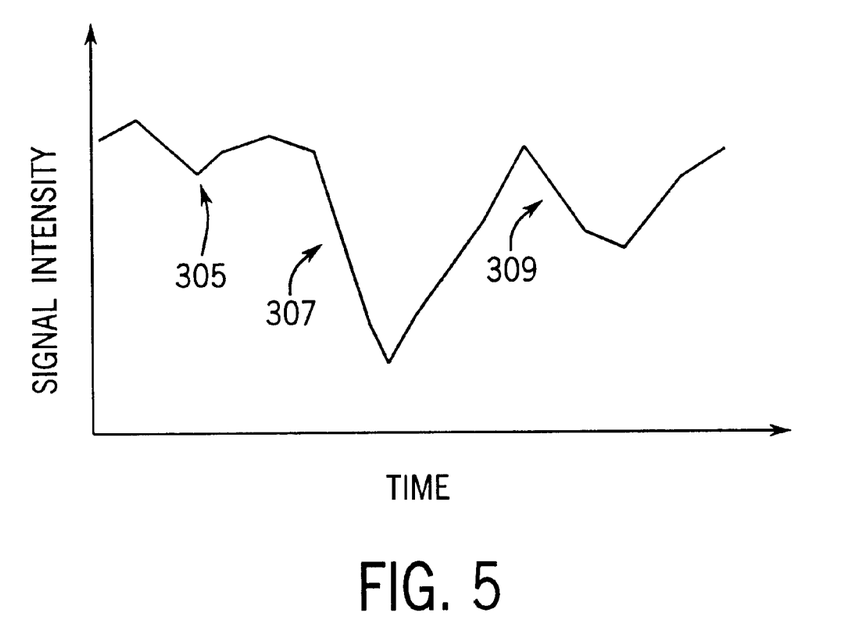
FIG. 5 is a graphic representation of a typical time course voxel signal S(t) produced from data in FIG. 4.

The time course NMR image data for one voxel in the array 301 is referred to herein as a time course voxel study. One such-study is illustrated in FIG. 4 by the dashed line 302. Each time course voxel study 302 indicates the magnitude of the NMR signal at a voxel in the image slice over the time course study and a typical signal S(t) for a voxel is shown in FIG. 5.

The signal S(t) is characterized by a noisy pre-contrast phase 305 in which the signal varies within a limited range, followed by a sudden drop in the signal at bolus arrival 307. The signal S(t) recovers as the contrast bolus passes through the voxel and then it drops again when the contrast bolus recirculates at 309 and enters the voxel for a second pass.

Figure 6:
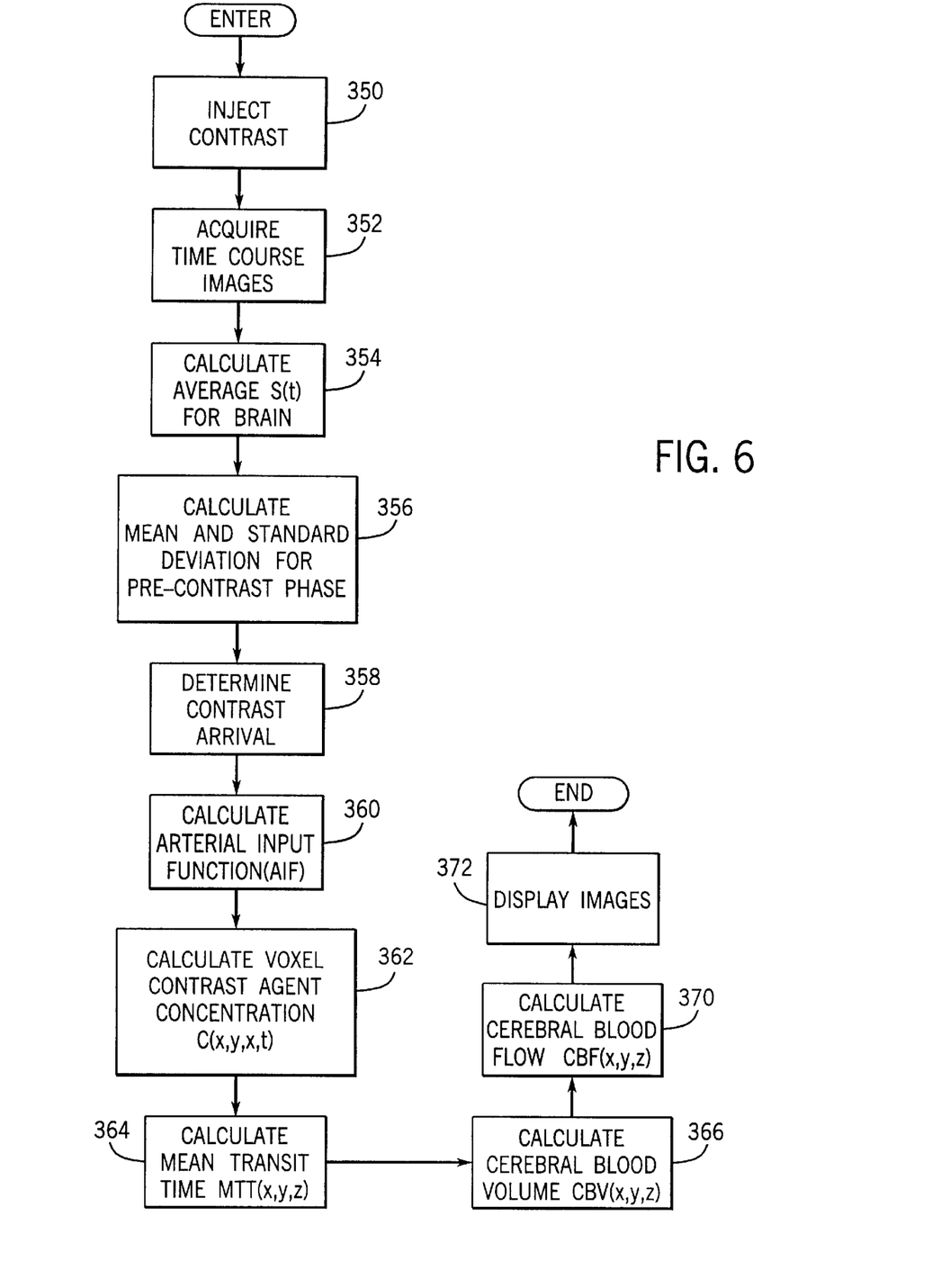
FIG. 6 is a flow chart which illustrates the steps used to practice a preferred embodiment of the invention.

Referring particularly to FIG. 6, the present invention is employed in a procedure which starts with the injection of a contrast agent into the subject as indicated at process block 350. The time course NMR image data is then acquired at process block 352 as described above. Because it is usually necessary to throw out the first 5 or 6 seconds of acquired data in the study, it is common practice to start the data acquisition step 352 10 to 15 seconds prior to the contrast injection step 350. This insures that there is adequate NMR data acquired prior to contrast arrival. The data acquisition step 352 typically requires from one to two minutes to complete. After the images are reconstructed as described above, the average brightness of all acquired brain voxels is calculated for each image frame as indicated at block 354.

$$S_{AVG}(t) = \frac{1}{N_{voxels}} \sum_{all\ voxels} S(x_i, y_i, z_i, t) \quad (1)$$

where $N_{VOXELS},.,$: total number of brain voxels $N_x, N_y, N_z$=total number of voxels along the respective x, y and z axes $S(x_i, y_i, z_i, t)$=NMR signal magnitude at voxel during the image frame time t.

The resulting signal $S_{AVG}(t)$ indicates the average signal magnitude of all the voxels in the stack of 2D images acquired at time t.

As indicated at process block 356, the next step is to calculate the mean value of this average brain signal SAVG (t) during the pre-contrast phase 305 of the study. This is done by selecting a set of pre-contrast image frames and calculating the mean value So thereof as follows:

$$S_0 = \frac{1}{N} \sum_{i=1}^{N} S_{AVG}(t_i) \quad (2)$$

where N is the total number of pre-contrast images used. The standard deviation from this mean value So is then calculated as follows:

$$\sigma = \sqrt{\left(\frac{1}{N-1}\right) \sum_{i=1}^{N} (S_{AVG}(t_i) - S_0^2} . \quad (3)$$

After So and σ are computed for the signals from the whole brain, contrast arrival time is determined as indicated at process block 358. This is accomplished by first calculating the number of standard deviations a the average brain signal SAVG(t)varies from the pre-contrast mean brain signal So as a function of time (t):

$$N_\sigma(t) = \frac{S_{AVG}(t) - S_0}{\sigma} \quad (4)$$

The resulting standard deviation signal $N_\sigma(t)$ is then examined starting at the beginning of the dynamic study (t=0) until the average brain signal $S_{AVG}(t)$ drops more than three a below the pre-contrast brain signal average So (i.e., $N_\sigma(t)>-3$). This time (to) marks the end of the pre-contrast phase of the study in the voxel-by-voxel calculations to follow.

The standard deviation signal $N_\sigma(t)$ is also used to determine a contrast arrival time ($t_a$). The signal $N_\sigma(t)$ is examined as described above and the image frame at which the average brain signal $S_{AVG}(t)$ drops more than ten a below the pre-contrast brain signal average So (i.e., $N_\sigma(t)>-10$) is determined. The contrast arrival time ta is set to the previous image frame time, that is, the image frame time Just prior to the image frame in which $N_\sigma(t)$ drops below −10.

As will be described in more detail below with reference to FIG. 7, the next step as indicated at process block 360 is to calculate the arterial input function (AIF). This is accomplished automatically using the above information.

As indicated at process block 362, the contrast concentration curve C(x,y,z,t) for each image voxel is calculated next:

$$C(x,y,z,t) = -\ln(S(x,y,z,t)/S_0(x,y,z))/TE \quad (5)$$

where TE is the echo time of the MRI pulse sequence used to acquire the NMR data and $S_0(x,y,z)$ is the mean value of the voxel signal $S(x,y,z,t)$ during the pre-contrast phase of the study as calculated using the above equation (2). The end of the pre contrast phase is marked by the image frame at time to as determined above.

The next step, as indicated by process block 364, calculates the mean transit time for each image voxel:

$$MTT(x, y, z) = \frac{\sum_{PEAK} t \times C(x, y, z, t)}{\sum_{PEAK} C(x, y, z, t)} \quad (6)$$

where "peak" refers to the time limits which define the first passage of the contrast bolus. These time limits are determined when calculating the AIF as will be described in detail below and they essentially define the time limits of the peak in the arterial signal during the first pass of the contrast agent through the brain.

Figure 8:
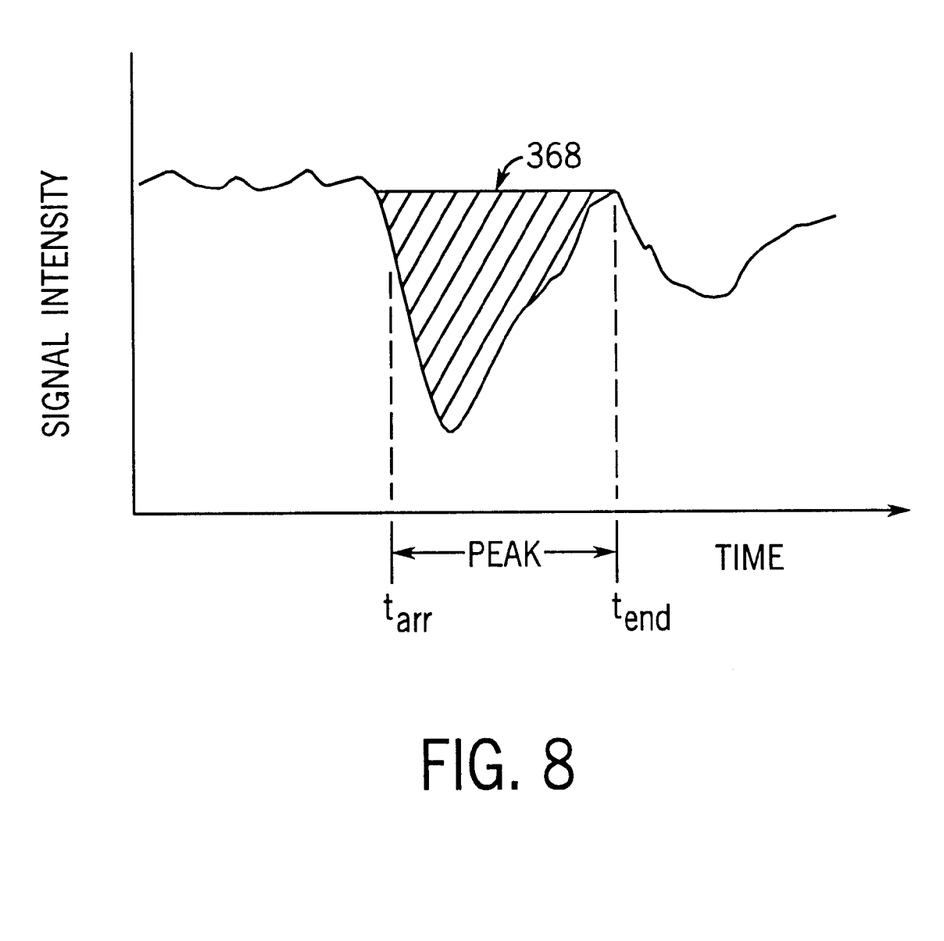
FIG. 8 is a graphic representation of an exemplary arterial input function.

As indicated at process block 366, the cerebral blood volume $CBV(x,y,z)$ can now be calculated for each voxel as follows:

$$CBV(x, y, z) = \frac{\sum_{PEAK} C(x, y, z, t)}{\sum_{PEAK} C(AIF, t)} \quad (7)$$

where "peak" refers to the time limits which define the first passage of the contrast bolus as described above and the denominator is the area defined by the peak in the arterial input function (AIF) as shown at 368 in FIG. 8.

The final calculation is the cerebral blood flow $CBF(x, y, z)$, as indicated at process block 370. This employs the CBV and MTT values from equations (6) and (7):

$$CBF(x, y, z) = \frac{CBV(x, y, z)}{MTT(x, y, z)}. \quad (8)$$

An alternative method of calculating the CBF is to perform a mathematical deconvolution of each voxels concentration versus time curve using the AIF as has been described by L. Ostergarrd et al "High Resolution Measurement of Cerebral Blood Flow Using Intravascular Tracer Bolus Passages. Part 1: Mathematical Approach and Statistical Analysis", Magnetic Resonance in Medicine, 36:715–725 (1996).

Images may now be produced from the calculated hemodynamic parameters as indicated at process block 372. The MTT, CBV and CBF values calculated in equations (6), (7) and (8) provide the magnitudes of these respective hemodynamic parameters at each voxel within the x, y, and z extent of the acquired NMR data. These magnitudes are used to control the brightness of the corresponding pixels in any chosen image. For example, transverse 2D images through the brain with pixel brightness modulated by the CBF (x,y,z) values will show re&ns with less blood flow as darker than regions with more blood flow. Since the brain is substantially symmetrical about its center, physicians typically look for differences in brightness in corresponding regions in the left and right sides of the brain. A region on one side of the brain which is significantly darker than the corresponding region on the other side of the brain is at risk of further infarction.

Calculating the Arterial Input Function (AIF)

Figure 7:
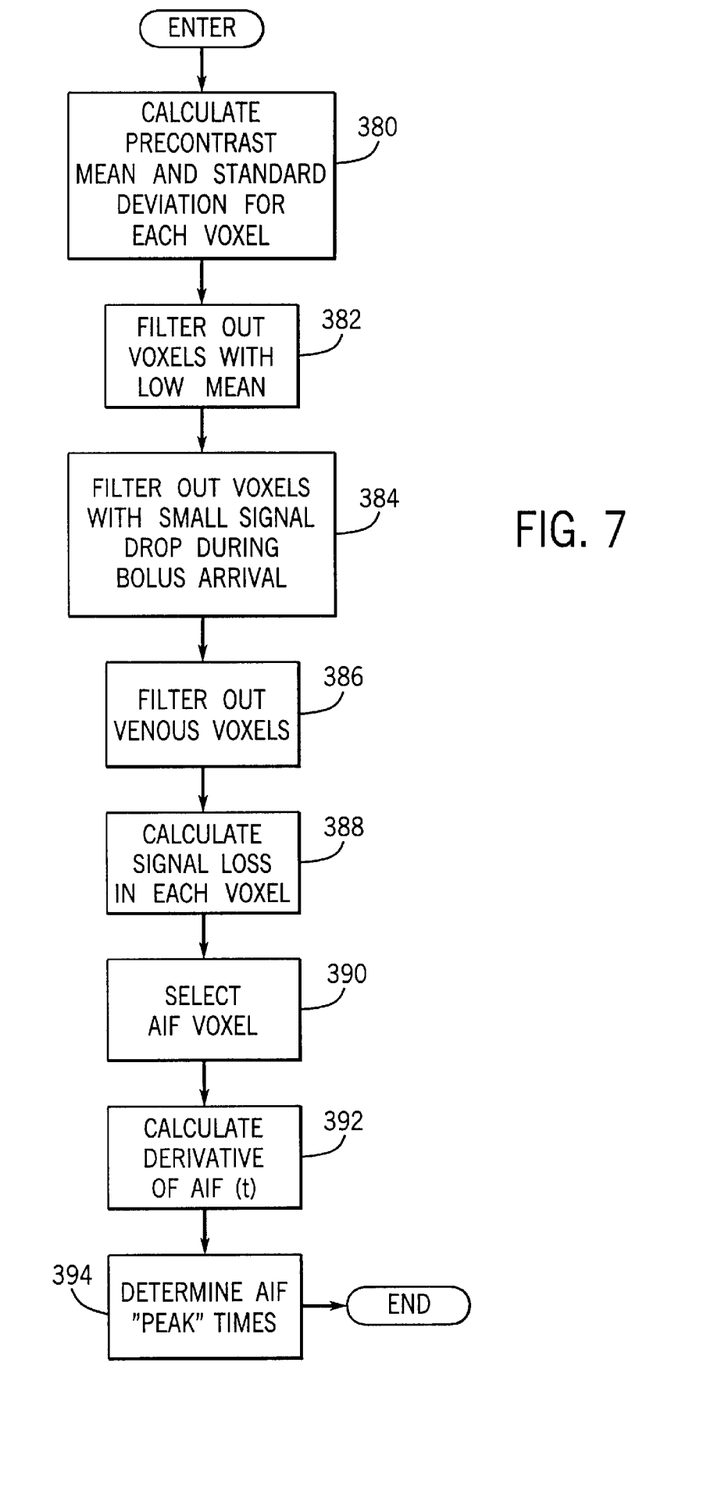
FIG. 7 is a flow chart which illustrates a preferred method for calculating AIF for use in the procedure of FIG. 6.

Referring particularly to FIG. 7, the AIF is calculated automatically from the acquired NMR image data. The general objective of this automated procedure is to locate the image voxel which has a signal S(t) that best represents the signal produced by arterial blood flow into the brain. The first step in this automated process at block 380 calculates the mean value of each voxel signal $S(x,y,z,t)$ during the pre-contrast phase of the study:

$$S_0(x, y, z) = \frac{1}{N}\sum_{t=1}^{t_0} S(x, y, z, t) \quad (9)$$

where N is the number of image frames during the pre-contrast phase which ends at frame $t_o$.

Similarly, the variance of each voxel signal during the precontrast phase is calculated:

$$\sigma(x, y, z) = \sqrt{\left(\frac{1}{N-1}\right)\sum_{t=1}^{t=t_0} (S(x, y, z, t) - S_0)^2} . \quad (10)$$

The next step is to remove from consideration those voxels which are clearly not arteries. As indicated at process block 382, this includes filtering out voxels whose mean pre-contrast signal $S_0(x,y,z)$ from equation (9) does not exceed a preset threshold value. These are typically voxels that are located in air outside the patient's head.

The next step is to remove from consideration voxels that do not demonstrate a significant signal drop after the completion of the pre-contrast phase as indicated at process block 384. This is accomplished by examining each voxel signal $S(x,y,z,t)$ during the four successive time frames starting with the frame at the above-determined whole-brain contrast arrival time $t_a$. All voxels having less than five standard deviation loss (i.e., $5^*\sigma(x,y,z)$) in signal strength from its pre-contrast mean (i.e., $S_0(x,y,z)$) signal strength is removed from consideration. Of the voxels which remain, the first image frame in which each voxel signal $S(x,y,z,t)$ drops five deviations below its pre-contrast mean is marked as the contrast arrival time $(t_{arr})$ for that voxel.

The next step, as indicated by process block 386, is to filter out venous voxels. These are characterized by late contrast arrival times $(t_{arr})$ and they are removed if their arrival time is more than two seconds later than the earliest recorded voxel arrival time $(t_{arr})$ among the remaining candidate voxels.

The final step in locating an arterial voxel is to examine the magnitude of the signal loss during contrast arrival for each of the remaining candidate voxels. As indicated at process block 388 this is accomplished by summing the signal loss in each candidate voxel in four consecutive image frames $$\Delta S(x, y, z) = \sum_{t=t_{arr}}^{t_n+4} S(x, y, z, t) - S_0(x, y, z). \quad (11)$$

Although one could simply look for the single greatest signal drop during an interval, it has been found that by summing signals from a plurality of image frames, momentary noise spikes do not disrupt the search. The voxel with the maximum drop in signal strength $\Delta S$ is selected as the AIF voxel as indicated at process block 390. Its signal $S(x,y,z,t)$ is selected as the function AIF(t) for use in the above-described calculations.

The "peak" in the AIF(t) function is determined by calculating its derivative as indicated at process block 392. This is done by calculating the change in signal for the AIF voxel from one image frame to the next. The time at which the AIF derivative changes from negative to positive is identified as the peak time. After the first pass of the bolus of contrast agent through the AIF voxel, a second passage of the same bolus is observed shortly thereafter. This recirculation effect must be removed from AIF(t) during the above calculations and this is accomplished by locating the point in the AIF(t) signal when the recirculation peak arrives. This is detected as a change in the derivative of AIF(t) from plus to minus at a time $t_{end}$ after the above detected peak. The AIF "peak" is thus established between the AIF voxel arrival time $t_a$, and the arrival of the recirculation bolus at $t_{end}$.

The ability to automatically and reliably determine physiologic parameters relevant to the treatment of acute stroke is a significant improvement over prior methods. A significant limitation of the prior methods for the rapid assessment of acute stroke is the lengthy post-processing time required for proper interpretation of the MRI exam. In addition the human error associated with operator defined input to the post processing in prior systems prohibits the widespread use of this technology. Therefore, the automated determination of the AIF successfully eliminates two of the impediments to the use of this technology. The invention described herein produces an optimal AIF, resulting in extremely accurate measurements of CBF, CBV and MTT.

What is claimed is:

1. A method for producing a magnetic resonance image (MRI) of a hemodynamic parameter in tissues, the steps comprising:

a) performing a contrast-enhanced magnetic resonance study of the tissues in which a series of MRI images are acquired as a contrast agent flows through the tissues;

b) forming a time course NMR image data set with the acquired MRI images, the time course NMR image data set providing a plurality of time course voxel studies which indicate the magnitude of NMR signals produced during the study at voxels throughout the tissues;

c) automatically producing an, arterial input function (AIF) by selecting one of the time course voxel studies based on an analysis of the NMR signals produced during the study;

d) calculating a hemodynamic parameter for each voxel using the corresponding time course voxel study and the AIF produced in step c); and e) producing an image in which the brightness of pixels therein is modulated by the hemodynamic parameters calculated in step d).

2. The method as recited in claim 1 in which the hemodynamic parameter is blood flow.

3. The method as recited in claim 1 in which the hemodynamic parameter is blood volume.

4. The method as recited in claim 1 in which the hemodynamic parameter is mean transit time.

5. The method as recited in claim 1 in which the arterial input function (AIF) is produced by selecting one of the time course voxel studies having the maximum signal loss as the contrast agent flows through the voxel.

6. The method as recited in claim 1 in which step c) is performed by:

i) calculating a mean signal value for each time course voxel study prior to arrival of the contrast agent;

ii) determining a set of candidate time course voxel studies by filtering out time course voxel studies that are not arterial;

iii) calculating signal loss below the mean signal value for each candidate time course voxel study; and iv) selecting a time course voxel study having the maximum signal loss.

7. The method as recited in claim 6 in which step ii) includes:

filtering out time course voxel studies which have a mean signal value below a selected value.

8. The method as recited in claim 6 in which step ii) includes:

filtering out time course voxel studies which indicate by the timing of their signal loss that they are venous voxels.

9. The method as recited in claim 1 which includes determining a peak time in the AIF produced in step c) which indicates maximum contrast agent signal modulation, and the calculations in step d) employ the peak time to calculate the hemodynamic parameter.

10. In a contrast enhanced magnetic resonance image study in which a series of images are acquired as a contrast agent flows through a region of interest, a method for automatically producing a signal indicative of the change in NMR signal in an artery which supplies blood to the region of interest, the steps comprising:

a) arranging the acquired images in order to form time course voxel studies which indicate the magnitude of NMR signals produced in each voxel in the region of interest during the study; and b) selecting one of the time course voxel studies based on an analysis of the NMR signals produced in said voxels, said analysis including steps which detect characteristics produced by arterial blood flow through the voxels.

11. The method as recited in claim 10 in which the analysis in step b) includes:

i) filtering out time course voxel studies which do not exhibit a significant change in NMR signal magnitude when the contrast agent arrives in the tissues;

ii) filtering out time course voxel studies which exhibit a change in NMR signal magnitude a significant time after the first arrival of the contrast agent in the tissues; and iii) selecting from the remaining time course voxel studies that time course voxel study which exhibits the most change in NMR signal magnitude when the contrast agent arrives.

* * * * *